US010276493B2

(12) United States Patent
Hsia et al.

(10) Patent No.: US 10,276,493 B2
(45) Date of Patent: Apr. 30, 2019

(54) SEMICONDUCTOR STRUCTURE AND METHOD FOR FABRICATING THE SAME

(71) Applicant: Vanguard International Semiconductor Corporation, Hsinchu (TW)

(72) Inventors: Wei-Lun Hsia, Hsinchu (TW); Chun-Hsien Lin, Jhudong Township, Hsinchu County (TW); Hsiao-Ying Yang, Hsinchu (TW)

(73) Assignee: VANGUARD ENTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/666,118

(22) Filed: Aug. 1, 2017

(65) Prior Publication Data

US 2019/0043801 A1    Feb. 7, 2019

(51) Int. Cl.
*H01L 23/522* (2006.01)
*H01L 21/768* (2006.01)
*H01L 23/528* (2006.01)
*H01L 23/532* (2006.01)

(52) U.S. Cl.
CPC .... *H01L 23/5226* (2013.01); *H01L 21/76816* (2013.01); *H01L 21/76819* (2013.01); *H01L 21/76831* (2013.01); *H01L 21/76837* (2013.01); *H01L 21/76843* (2013.01); *H01L 21/76879* (2013.01); *H01L 23/5283* (2013.01); *H01L 21/7682* (2013.01); *H01L 21/76849* (2013.01); *H01L 23/53295* (2013.01)

(58) Field of Classification Search
CPC .......... H01L 21/76816; H01L 21/7682; H01L 21/76829; H01L 21/76841; H01L 21/76843; H01L 21/76837
See application file for complete search history.

(56) References Cited

U.S. PATENT DOCUMENTS

| 6,031,287 | A | * | 2/2000 | Harshfield | ......... | G11C 13/0004 |
| | | | | | | 257/734 |
| 6,191,004 | B1 | * | 2/2001 | Hsiao | ................ | H01L 21/76224 |
| | | | | | | 257/E21.546 |
| 6,331,460 | B1 | * | 12/2001 | Kizilyalli | .......... | H01L 21/76843 |
| | | | | | | 257/E21.021 |
| 2003/0062590 | A1 | * | 4/2003 | Anthony | ........... | H01L 21/76838 |
| | | | | | | 257/529 |
| 2006/0038217 | A1 | * | 2/2006 | Mikawa | ............ | H01L 27/11502 |
| | | | | | | 257/306 |

(Continued)

FOREIGN PATENT DOCUMENTS

TW          396545 B        7/2000
TW       200644159 A       12/2006

*Primary Examiner* — Syed I Gheyas
(74) *Attorney, Agent, or Firm* — Birch, Stewart, Kolasch & Birch, LLP (57) ABSTRACT

A semiconductor structure includes a conductive feature on a substrate. A plurality of first dielectric layers are disposed on the conductive feature, and stress directions of at least two of the first dielectric layers are different from one another. A first hole penetrates through the plurality of the first dielectric layers to expose the conductive feature. A first conductive plug conformally covers the first hole and is electrically connected to the conductive feature. A first insulating plug on the first conductive plug fills the first hole.

19 Claims, 6 Drawing Sheets

(56) References Cited

U.S. PATENT DOCUMENTS

| | | | |
|---|---|---|---|
| 2006/0276027 A1* | 12/2006 | Lu | H01L 21/76801 438/622 |
| 2012/0092806 A1* | 4/2012 | Hua | H01L 23/5223 361/306.3 |
| 2016/0247755 A1* | 8/2016 | Fukumaki | H01L 21/76802 |

* cited by examiner

SEMICONDUCTOR STRUCTURE AND METHOD FOR FABRICATING THE SAME

BACKGROUND

Technical Field

The disclosure relates to a semiconductor structure, and more particularly to a plug structure applicable to ultra-thick capacitor.

Description of the Related Art

Traditionally, due to the limited gap filling capabilities, a contact/via plug structure connecting adjacent metal layers is only applicable to small holes and thin inter layer dielectric (ILD) layers. However, in a high-voltage process, the inter layer dielectric (ILD) layer and the inter metal dielectric (IMD) layer of a high-voltage device should be thicker to prevent breakdown within the metal layers. When the ILD layer is thicker, the holes are not filled up due to the limited gap filling capabilities. The stress is also not uniform and can result in wafer warpage.

Interconnect structures are formed in a back-end of line (BEOL) of semiconductor process. A Metal-Oxide-Metal (MOM) capacitor may also be formed by adjacent metal layers and the ILD layers in the same process. As semiconductor processing advances, the dimensions are reduced and there are more BEOL metal layers. The capacitance of an MOM capacitor available for designers increases. An MOM capacitor is closely related to the BEOL process capability. The structure and the material of the conductive plugs and ILD layer have a significant impact on the MOM capacitor.

Therefore, although existing plug structures have generally been adequate for their intended purposes, they have not been entirely satisfactory in all respects and need to be improved, especially with respect to those plug structures applicable to ultra-thick capacitors.

BRIEF SUMMARY

The present disclosure provides a semiconductor structure. The semiconductor structure includes a conductive feature on a substrate. The semiconductor structure further includes a plurality of first dielectric layers disposed on the conductive feature. Stress directions of at least two of the plurality of first dielectric layers are different from one another. The semiconductor structure further includes a first hole penetrates through the plurality of first dielectric layers to expose the conductive feature. The semiconductor structure further includes a first conductive plug that conformally covers the first hole and that is electrically connected to the conductive feature. The semiconductor structure further includes a first insulating plug on the first conductive plug that fills the first hole.

The present disclosure also provides a method for fabricating a semiconductor structure. The method for fabricating a semiconductor structure includes providing a substrate with a conductive feature. The method for fabricating a semiconductor structure further includes forming a plurality of first dielectric layers on the conductive feature. Stress directions of at least two of the plurality of first dielectric layers are different from one another. The method for fabricating a semiconductor structure further includes etching the plurality of first dielectric layer to form a first hole exposing the conductive feature. The method for fabricating a semiconductor structure further includes conformally forming a first conductive plug in the first hole. The method for fabricating a semiconductor structure further includes forming a first insulating plug on the first conductive plug in the first hole. The method for fabricating a semiconductor structure further includes performing a planarization process on the first insulating plug.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a plug structure applicable to an ultra-thick capacitor. During the metal line process, the conductive plug is conformally formed in the hole at the same time. The connection is made and the number of steps in the process is reduced. Moreover, the stress can be made uniform by alternately stacking compressive stress layers and tensile stress layers. The wafer warpage issue may be overcome.

Figure 1:
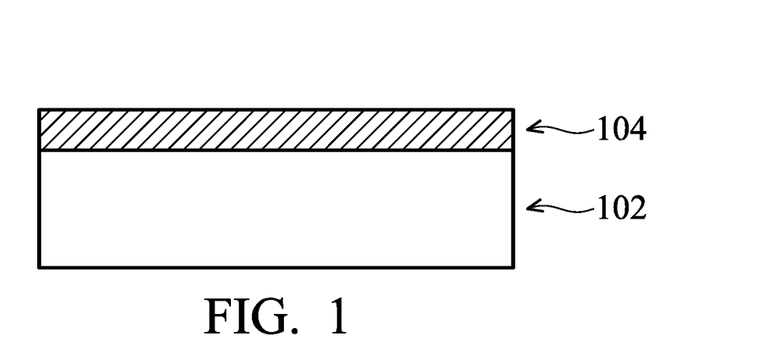
FIGS. 1-8 are cross-sectional representations of various stages of forming a semiconductor structure in accordance with some embodiments.

FIGS. 1 to 8 are cross-sectional representations of various stages of forming the semiconductor structure 100 in accordance with some embodiments of the present disclosure. As shown in FIG. 1, a substrate 102 is provided. The substrate 102 may be a semiconductor wafer, a chip, or a circuit board. The substrate 102 may include semiconductor materials such as Si, Ge, InAs, InP, GaAs, or other III-V compounds. Furthermore, the substrate 102 may also be a semiconductor on insulator (SOI) substrate. Interconnect structures, isolation structures, gate structures, bit lines, contact plugs, and capacitors may also be formed on the substrate 102. For simplicity, the structures on the substrate 102 are not shown in FIG. 1.

Next, a conductive feature 104 is formed on the substrate 102. The conductive feature 104 may include gate electrodes, diffusion region electrodes, contact plugs, metal lines, capacitor electrodes, or other conductive structures. The material of the conductive feature 104 may be doped silicon, Al, Ag, Cu, AlCu, Pt, W, Ru, Ni, TaN, TiN, TiAlN, TiW, or a combination thereof. The conductive feature 104 may be formed by sputtering, resistive heating evaporation, e-beam evaporation, physical vapor deposition (PVD), or another suitable deposition process.

Figure 2:
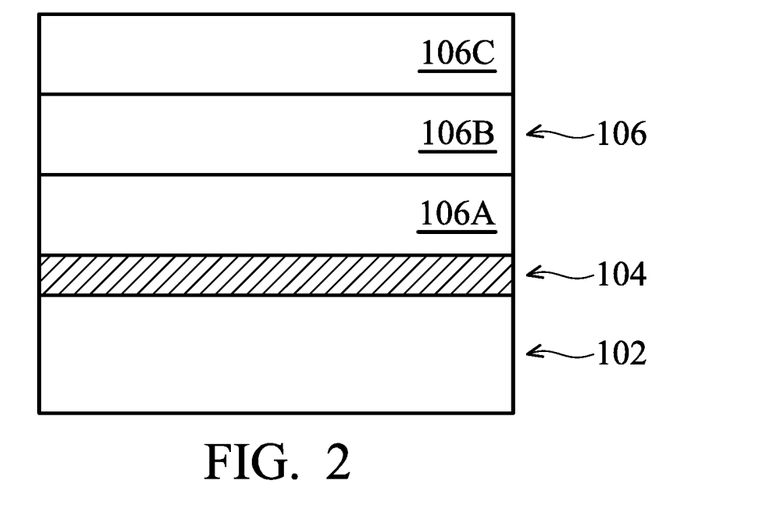

As shown in FIG. 2, after that, a plurality of first dielectric layers 106 including dielectric layers 106A, 106B, and 106C are formed on the conductive feature 104. The first dielectric layers 106 may be silicon oxide, silicon nitride, silicon oxynitride, or any other suitable dielectric materials, or a combination thereof formed by chemical vapor deposition (CVD). For example, chemical vapor deposition (CVD) may be low-temperature chemical vapor deposition (LTCVD), low-pressure chemical vapor deposition (LPCVD), plasma enhanced chemical vapor deposition (PECVD), spin-on-glass (SOG), or other suitable process.

The total thickness of the plurality of first dielectric layers 106 is between 3 µm and 9 µm, such as 6 µm according to some embodiments. If the total thickness of the plurality of first dielectric layers 106 is too thin, for high voltage devices such as power MOSFET like lateral double diffused MOS (LDMOS) or vertical double diffused MOS (VDMOS), it can easily lead to breakdown between the metal layers. If the total thickness is too thick, it may not be easy to form conductive plugs in the subsequent process due to the limited gap filling capabilities.

If only a single dielectric layer is applied, the compressive stress may be too strong to be compatible with the tensile stress caused by the subsequently formed conductive plug. The net stress may be too strong and result in wafer warpage. Wafer warpage may cause the chuck of the tool in the subsequent process not being able to effectively absorb the wafer, making the wafer slip or overheat and burn out, thereby impacting the product yield.

The net stress may be fine-tuned by alternately stacking compressive stress dielectric layers and tensile stress dielectric layers according to some embodiments. The wafer warpage issue may be under control. The material or thickness of each dielectric layer 106A, 106B, and 106C in the plurality of first dielectric layers 106 may be modified to bring in different stress directions and magnitude according to some embodiments. The stress directions of two adjacent dielectric layers may be the same, depending on the net stress demand according to some other embodiments.

It should be noted that although there are three first dielectric layers 106A, 106B, and 106C shown in FIG. 2, the present disclosure is not limited. The plurality of first dielectric layers 106 may have two layers or more than three dielectric layers.

Figure 3:
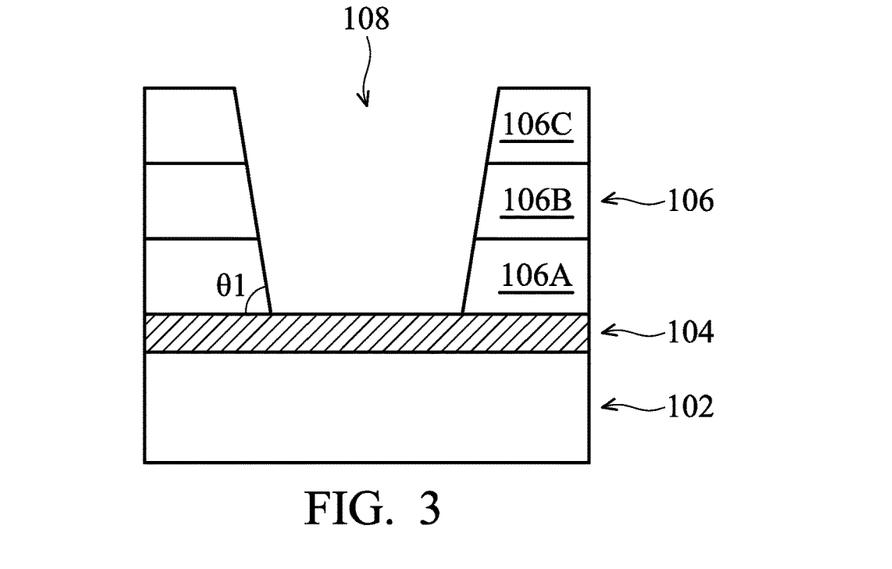

Next, as shown in FIG. 3, the hole 108 penetrating the plurality of dielectric layers 106 to expose the conductive feature 104 is formed by photolithography and etching process. The photolithography process may include photoresist coating, soft baking, mask aligning, pattern exposure, post-exposure baking, photoresist development, and hard baking, etc. The etching process may include reactive ion etching (RIE), plasma etching, or another suitable etching process. The size of the hole 108 is between 1.8 µm and 7 µm. If the hole is too large, the layout area may increase. If the hole is too small, it is not easy to form conductive plugs in subsequent processes due to the limited gap filling capabilities.

By fine-tuning the parameters of the etching process, such as the reactant gas ratio, solution species, solution flow rate, and vertical and horizontal etching rate, etc., the tilt angle θ1 of the sidewall of the hole 108 is between 75 degrees and 85 degrees, preferably between 75 degrees and 80 degrees. If the angle is too steep, the step coverage of subsequent process is worse. In the subsequent deposition process, the deposited film may also not be able to adhere on the sidewall of the hole 108. If the angle is too gentle, the circuit may short, or the layout area may increase, raising the cost of production.

Figure 4:
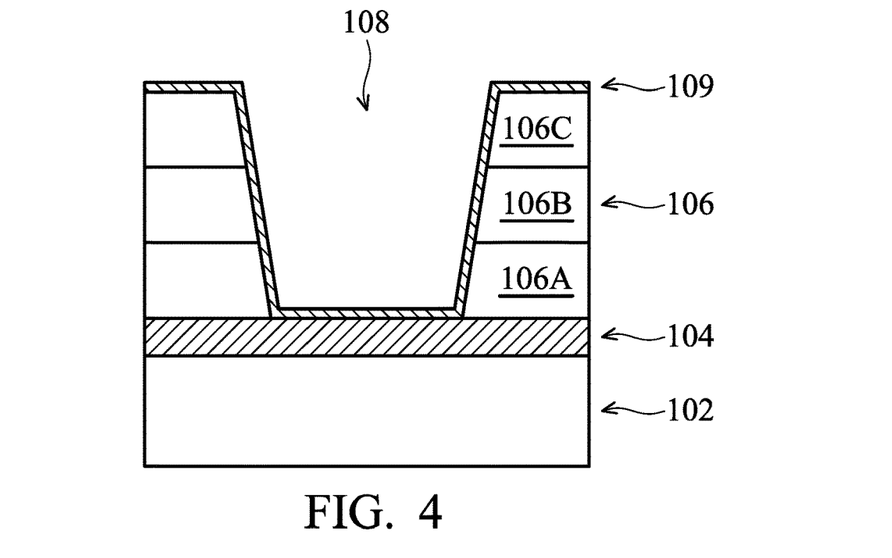

Next, as shown in FIG. 4, an adhesive layer 109 is conformally formed in the hole 108 and on the top surface of the plurality of dielectric layers 106. The adhesive layer 109 easily bonds with subsequent deposition films. Therefore, the subsequent deposition films can more easily adhere to the sidewall of the hole 108 without slipping. The adhesive layer 109 may be also used as a barrier layer to prevent heteroatom diffusion. The adhesive layer 109 may be formed by sputtering, resistive heating evaporation, e-beam evaporation, physical vapor deposition (PVD), chemical vapor deposition (CVD), or another suitable deposition process. The adhesive layer 109 may include Ti, Cr, $TiO_2$, Zr, Ta, TaN, and TiN. Its thickness is between 0.05 µm and 0.1 µm.

Figure 5:
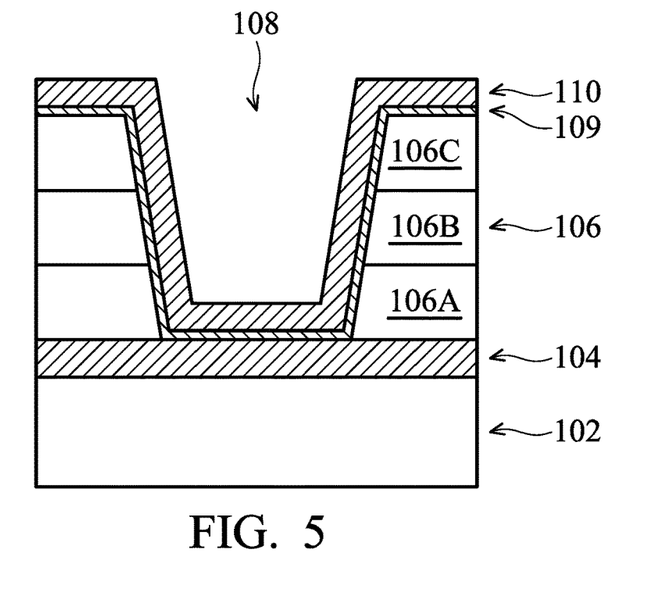

As shown in FIG. 5, after the adhesive layer 109 is formed, the conductive plug 110 is conformally formed on the sidewall and the bottom of the hole 108 and on the top of the dielectric layer 106C, and electrically connected to the conductive feature 104. The conductive plug 110 may be a contact plug or a via plug. The conductive plug 110 above the dielectric layer 106C may electrically connect to adjacent conductive features.

The thickness of the conductive plug is between 0.5 µm and 3.5 µm. If the conductive plug is too thick, the stress is strong enough to cause wafer warpage. If the conductive plug is too thin, it does not easily adhere to the sidewall of the hole 108 and therefore the electrical connection is worse.

The material of the conductive plug 110 may be Al, Ag, Cu, AlCu, Pt, W, Ru, Ni, TaN, TiN, TiAlN, TiW, or a combination thereof. The conductive plug 110 may be formed by sputtering, resistive heating evaporation, e-beam evaporation, physical vapor deposition (PVD), or another suitable deposition process.

In an embodiment, a barrier layer may be formed above and below the conductive plug 110 (not shown) to prevent the conductive material of the conductive plug 110 diffusing to the dielectric layers. The material of the barrier layer may be TiN, Ti, Ta, TaN, W, WN, or a combination thereof. The thickness of the barrier layer is between 0.2 μm and 0.8 μm. If the barrier layer is too thick, the conductivity of the conductive plug may be worse. If the barrier layer is too thin, the atomic diffusion may not be restrained effectively.

Figure 6:
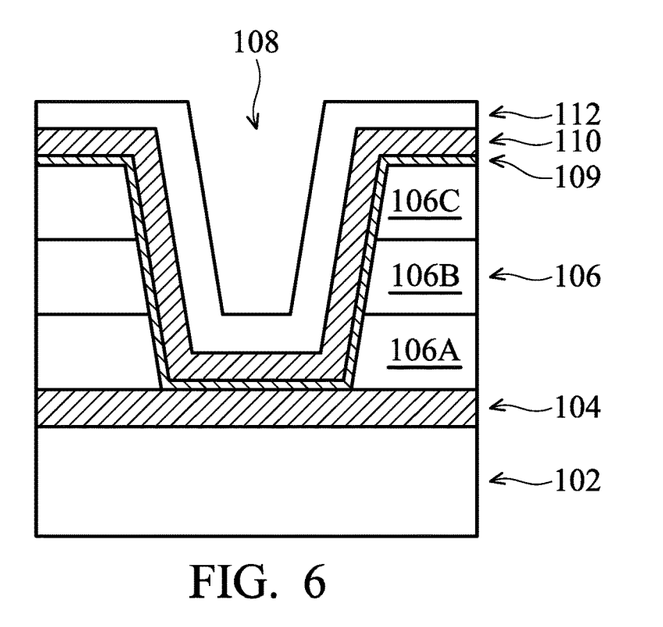

Next, insulating material is used to fill up the hole 108 to form an insulating plug. In an embodiment as shown in FIG. 6, the first insulating layer 112 is conformally formed in the hole 108 covering the conductive plug 110. The first insulating layer 112 may be formed by high-temperature furnace oxidation or chemical vapor deposition (CVD). For example, the first insulating layer 112 may be a silicon oxide layer, silicon nitride layer, silicon oxynitride layer, or any other suitable layer, or a combination thereof formed by chemical vapor deposition (CVD). Examples of chemical vapor deposition (CVD) processes include low-pressure chemical vapor deposition (LPCVD), low-temperature chemical vapor deposition (LTCVD), rapid thermal chemical vapor deposition (RTCVD), plasma enhanced chemical vapor deposition (PECVD), high-density plasma chemical vapor deposition (HDPCVD), flowable chemical vapor deposition (FCVD), sub-atmospheric Chemical Vapor Deposition (SACVD), or other conventional methods. In an embodiment, a deposition process with better step coverage may be selected.

The thickness of the first insulating layer 112 is between 0.5 μm and 2 μm. If the first insulating layer 112 is too thick, the deposition cost may be too high. If the first insulating layer 112 is too thin, the conductive plug 110 may be not completely covered and the conductivity of conductive plug 110 may be impacted.

Figure 7A:
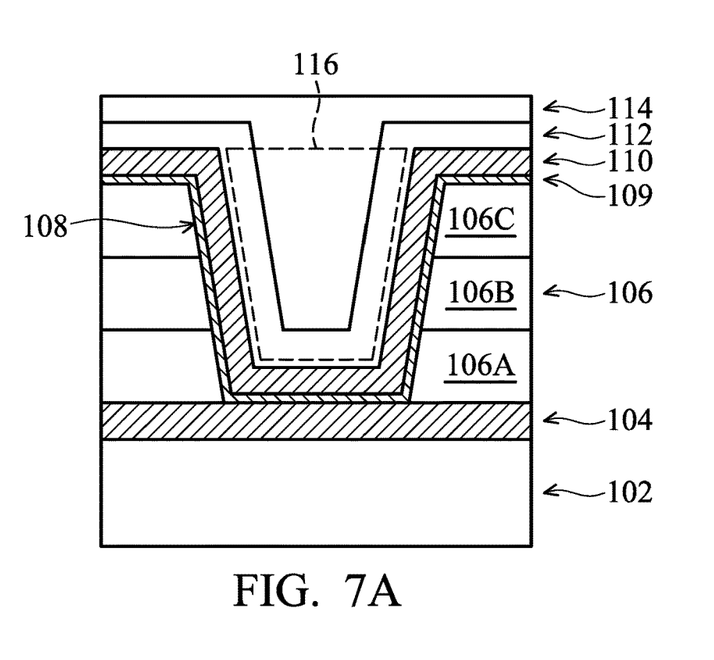

Next, as shown in FIG. 7A, the second insulating layer 114 is formed on the first insulating layer 112 and the hole 108 is substantially filled up. In an embodiment, the second insulating layer 114 may substantially fill up the hole 108 by high deposition rate tetraethyl orthosilicate (TEOS) deposition, sub-atmospheric chemical vapor deposition (SACVD), spin-on-glass (SOG), or another conventional method. In an embodiment, a deposition process with a faster deposition rate and a lower cost may be selected.

Figure 7B:
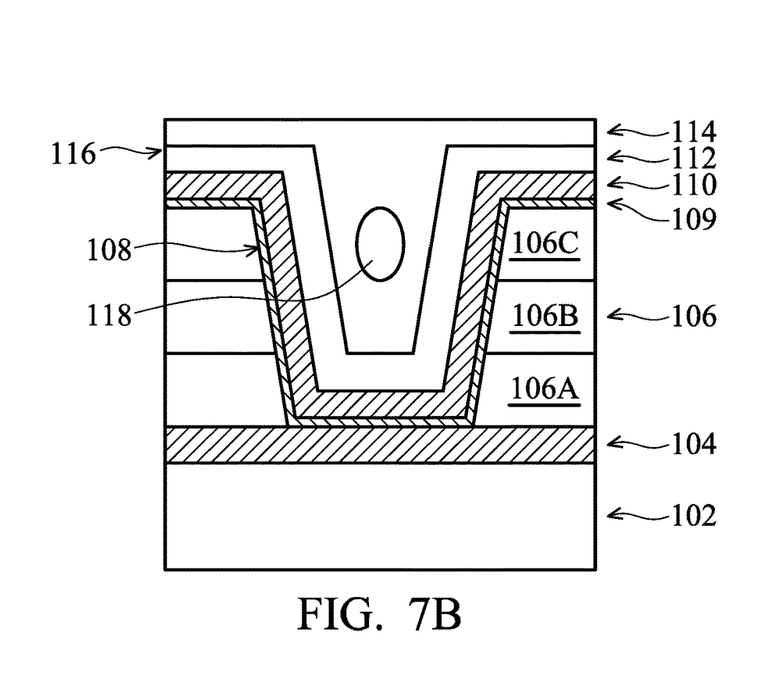

In some embodiments, an overhang is formed at the top of the hole 108 due to the faster deposition rate. As shown in FIG. 7B, when the overhang of the second insulating layer 114 is merged with each other, a void 118 is formed in the hole 108. The depth and location of the void 118 may be controlled by the process forming the second insulating layer 114, making sure it is not contacting the conductive plug 110. In some embodiments, the depth of the void 118 is between 2 μm and 6 μm. If the void 118 is too deep, it may contact the conductive plug 110 and conductivity may be impacted. If the void 118 is too shallow, a crack may form on the tip of the void 118 when stress is applied.

The portion with which the first insulating layer 112 and the second insulating layer fill in the hole 108 may be regarded as an insulating plug 116. As shown in FIG. 7A, the insulating plug 116 may further extend over the conductive plug 110 above the dielectric layers 106 avoiding exposure of the metal of the conductive plug 110. As mentioned above, in some embodiments, there are two steps of forming the insulating plug 116, including the process of forming the first insulating layer 112 and the process of forming the second insulating layer 114. The first insulating layer 112 may be formed by a deposition process with better step coverage, such as high-density plasma chemical vapor deposition (HDPCVD) for good deposition quality. The second insulating layer 114 may be formed by a deposition process with a lower cost, such as sub-atmospheric chemical vapor deposition (SACVD) or high deposition rate tetraethyl orthosilicate (TEOS) deposition to reduce the cost of production. In other embodiments, the insulating plug 116 may be formed by a single insulating layer or multiple insulating layers, depending on process demand and cost.

Figure 8:
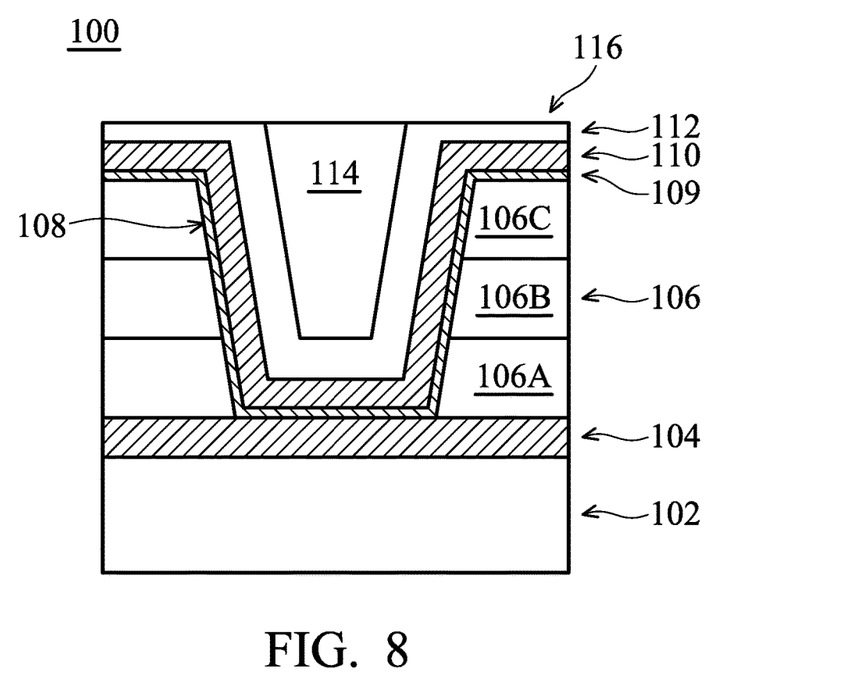

Next, as shown in FIG. 8, a planarization process is performed to polish the top surface of the insulating plug 116. The planarization process may include chemical mechanical polishing (CMP) and/or an etch-back process. The thickness of the insulating plug 116 after the planarization process depends on the process demand. In FIG. 8, the second insulating layer 114 outside the hole 108 is removed. However, it is not a limitation that the second insulating layer 114 outside the hole 108 may also be partially retained.

As mentioned above, in the present disclosure, a conductive plug is conformally formed in the hole. The inter layer dielectric (ILD) layer/inter metal dielectric (IMD) layer are formed by compressive and tensile dielectric layers to overcome the warpage issue. The conductive plug and the conductive lines may be formed at the same time to make a connection and reduce the production cost. The sizes of the dielectric layer and the conductive features are not limited by the gap filling capability. To make the conductive plug adhesive, the sidewall angle of the contact/via is fine-tuned and the adhesive layer is formed between the conductive plug and the dielectric layers. If there is a void during gap filling, the depth of the void is controlled to prevent the plug from cracking when stressed.

A capacitor may be formed with the above mentioned structure, including the top and bottom conductive features 110/104 and the ultra-thick ILD layer 106. The capacitor may be a single ultra-thick Metal-Oxide-Metal (MOM) capacitor.

Figure 9:
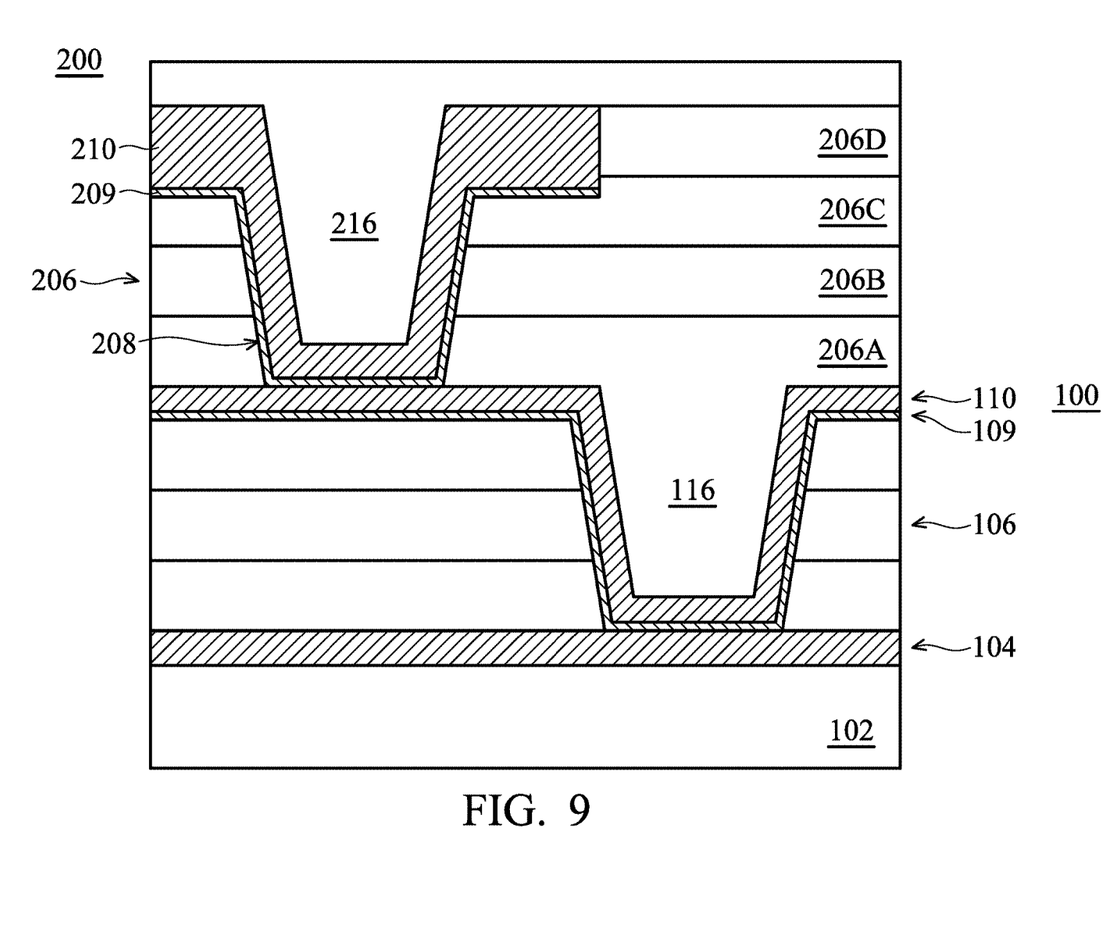
FIG. 9 is a cross-sectional representation of a semiconductor structure in accordance with some other embodiments.

Please refer to FIG. 9, which is a cross-sectional representation of semiconductor structure 200 with several conductive plugs. Some devices are the same as, or similar to those used in the above-mentioned embodiments and will use the same symbols.

As shown in FIG. 9, after forming the insulating plug 116 filling the hole 108 (like the step in FIG. 7A), the plurality of second dielectric layers 206 including 206A, 206B, 206C, and 206D are subsequently formed on it. The plurality of second dielectric layers 206 also includes alternately stacked compressive stress dielectric layers and tensile stress dielectric layers. Next, a hole 208 is formed in the plurality of second dielectric layers 206, exposing the part of conductive plug 110 that extends over the plurality of first dielectric layers 106. The conductive plug 210 is conformally formed in the hole 208 to electrically connect with the conductive plug 110 of the semiconductor structure 100. After that, the insulating plug 216 is filled in the hole 208 and on the conductive plug 210. The processes and materials used in forming the plurality of second dielectric layers 206, the hole 208, the conductive plug 210, and the insulating plug 216 may be similar to, or the same as, those used to form the semiconductor structure 100 and are not repeated herein.

As shown in FIG. 9 according to some embodiments, the semiconductor structure 200 may include the plurality of first/second dielectric layers 106/206 with the same or different thickness and stress directions/magnitude depends on process demands. The semiconductor structure 200 may also include the conductive plug 110/210 with the same or different thickness and hole sizes. In FIG. 9, there are only two conductive plugs in the plurality of plug structures, however, the present disclosure is not limited. It may have any number of conductive plugs.

The semiconductor structure 200 includes a plurality of conductive plugs, which can overcome the issue of poor gap filling capability and strong stress when a large conductive plug connects with adjacent conductive features. The plurality of ultra-thick metal-oxide-metal (MOM) structures may be formed by the plurality of conductive features and the plurality of dielectric layers. Moreover, to coordinate with the process of forming conductive plugs, the seal ring may also be modified as conductive structures conformally covering the hole. The process may be simplified and the production cost may be reduced when manufacturing the conductive plugs and the seal ring in the same process at the same time.

As mentioned above, in the present disclosure, the conductive plugs are conformally formed in the holes. The issue of warpage may be overcome by using compressive and tensile dielectric layers with different stress magnitudes and thickness forming inter layer dielectric (ILD) layers/inter metal dielectric (IMD) layers. The production cost may be reduced if the conductive lines and the conductive plugs are produced at the same time. The ultra-thick metal-oxide-metal (MOM) structure may be formed by the top and bottom conductive features and the ultra-thick dielectric layers between them. Meanwhile, the seal ring may also be large-size hole structure. Therefore, the seal ring may be modified as a conductive structure conformally covering the hole. If the conductive plug and the seal ring are manufactured in the same process, the process may be simplified and the production cost may be reduced, and also the limitation of the size of the dielectric layer and the conductive structure due to the limited gap filling capabilities is also eliminated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a conductive feature on a substrate;
    a plurality of first dielectric layers disposed on the conductive feature, wherein stress directions of at least two of the plurality of first dielectric layers are different from one another;
    a first hole penetrating through the plurality of first dielectric layers to expose the conductive feature;
    a first conductive plug conformally covering the first hole and being electrically connected to the conductive feature; and
    a first insulating plug on the first conductive plug and filling the first hole, and the first insulating plug comprises a first insulating layer and a second insulating layer, wherein the first insulating plug extends over the plurality of first dielectric layers, and wherein a top surface of the first insulating layer is coplanar with a top surface of the second insulating layer,
    wherein the first insulating layer is conformally formed in the first hole and the second insulating layer substantially fills up the first hole, and a bottom surface of the first insulating plug directly contacts a top surface of the first conductive plug.

2. The semiconductor structure as claimed in claim 1, wherein the first conductive plug further extends over the plurality of first dielectric layers.

3. The semiconductor structure as claimed in claim 1, wherein the first insulating plug further extends over the first conductive plug on the plurality of first dielectric layers.

4. The semiconductor structure as claimed in claim 1, wherein the plurality of first dielectric layers comprises alternately stacked compressive stress layers and tensile stress layers.

5. The semiconductor structure as claimed in claim 1, wherein a total thickness of the plurality of first dielectric layers is between 3 μm and 9 μm.

6. The semiconductor structure as claimed in claim 1, further comprising an adhesive layer under the first conductive plug, conformally covering the first hole and a top surface of the plurality of first dielectric layers.

7. The semiconductor structure as claimed in claim 6, wherein the adhesive layer comprises Ti, Cr, TiO2, Zr, Ta, TaN, or TiN.

8. The semiconductor structure as claimed in claim 1, further comprising barrier layers above and below the first conductive plug.

9. The semiconductor structure as claimed in claim 8, wherein the barrier layers comprise TiN, Ti, Ta, TaN, W, or WN.

10. The semiconductor structure as claimed in claim 1, wherein a tilt angle of a sidewall of the first hole is between 75 degrees and 85 degrees.

11. The semiconductor structure as claimed in claim 1, wherein the first insulating plug has a void in the first hole.

12. The semiconductor structure as claimed in claim 1, wherein the first conductive plug in the first hole is a contact plug or a via plug.

13. The semiconductor structure as claimed in claim 1, further comprising:
    a plurality of second dielectric layers disposed above the first conductive plug, wherein stress directions of at least two of the plurality of second dielectric layers are different from one another;
    a second hole penetrating through the plurality of second dielectric layers to expose the first conductive plug;
    a second conductive plug conformally covering the second hole and being electrically connected to the first conductive plug; and
    a second insulating plug on the second conductive plug filling the second hole.

14. A method for fabricating a semiconductor structure, comprising:
    providing a substrate with a conductive feature;
    forming a plurality of first dielectric layers on the conductive feature, wherein stress directions of at least two of the plurality of first dielectric layers are different from one another;
    etching the plurality of first dielectric layer to form a first hole exposing the conductive feature;
    conformally forming a first conductive plug in the first hole;
    forming a first insulating plug on the first conductive plug in the first hole; and
    performing a planarization process on the first insulating plug,
    wherein forming the first insulating plug comprises conformally forming a first insulating layer in the first hole and forming a second insulating layer to substantially fill up the first hole, and a bottom surface of the first insulating plug directly contacts a top surface of the first conductive plug, and wherein the first insulating plug extends over the plurality of first dielectric layers, and wherein a top surface of the first insulating layer is coplanar with a top surface of the second insulating layer.

15. The method for fabricating a semiconductor structure as claimed in claim 14, wherein forming a plurality of first dielectric layers on the conductive feature comprises alternately stacking compressive stress layers and tensile stress layers.

16. The method for fabricating a semiconductor structure as claimed in claim 14, further comprising, after forming the first hole, conformally forming an adhesive layer under the first conductive plug in the first hole and on a top surface of the plurality of first dielectric layers.

17. The method for fabricating a semiconductor structure as claimed in claim 14, wherein a tilt angle of a sidewall of the first hole formed during the etching of the plurality of first dielectric layers is between 75 degrees and 85 degrees.

18. The method for fabricating a semiconductor structure as claimed in claim 14, wherein when forming the first insulating plug, a void is formed in the first insulating plug in the first hole.

19. The method for fabricating a semiconductor structure as claimed in claim 18, wherein a depth of the void is between 2 μm and 6 μm.

\* \* \* \* \*